United States Patent
Hirsch et al.

(10) Patent No.: US 8,406,274 B1
(45) Date of Patent: Mar. 26, 2013

(54) SCHEDULED GAIN CONTROL IN COLLOCATED WIRELESS RECEIVERS USING FORWARD TIMED SIGNAL STRENGTH PREDICTIONS

(75) Inventors: Olaf Josef Hirsch, Sunnyvale, CA (US); Paul Husted, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 455 days.

(21) Appl. No.: 12/563,048

(22) Filed: Sep. 18, 2009

(51) Int. Cl.
*H04B 1/00* (2006.01)

(52) U.S. Cl. ........................................ 375/133

(58) Field of Classification Search .............. 375/133, 375/130, 345, 317, 318, 319, 260; 455/226.1, 455/226.2, 232.1
See application file for complete search history.

(56) References Cited

U.S. PATENT DOCUMENTS

| | | | |
|---|---|---|---|
| 2003/0181180 A1* | 9/2003 | Darabi et al. | 455/234.1 |
| 2004/0152429 A1* | 8/2004 | Haub et al. | 455/102 |
| 2004/0161026 A1* | 8/2004 | Jensen et al. | 375/224 |
| 2007/0010224 A1* | 1/2007 | Shi | 455/241.1 |

* cited by examiner

*Primary Examiner* — Khai Tran
(74) *Attorney, Agent, or Firm* — DeLizio Gilliam, PLLC

(57) ABSTRACT

An apparatus is disclosed comprising collocated primary receiver (PR) and a time synchronized receiver (TSR), with a Low Noise Amplifier (LNA) configured by a LNA gain control signal to create a shared amplified signal sent to the PR and the TSR for them to concurrently receive packets. The TSR is configured to generate a timed signal strength prediction signal based on the shared amplified signal and the LNA gain control signal. The primary receiver is configured to generate the LNA gain control signal based, at least in part, on the timed signal strength prediction signal. The PR may include a spread spectrum receiver, and the TSR may include a frequency hopping receiver.

34 Claims, 7 Drawing Sheets

SCHEDULED GAIN CONTROL IN COLLOCATED WIRELESS RECEIVERS USING FORWARD TIMED SIGNAL STRENGTH PREDICTIONS

TECHNICAL FIELD

This disclosure relates to a Wireless Local Area Networks (WLAN) and Bluetooth™ receiver coexistence scheme, more generally to collocated spread spectrum receivers and frequency hopping receivers and even more generally to collocated packetized protocol receivers and time synchronized receivers that share a common antenna and low noise amplifier producing a shared amplified signal.

BACKGROUND

By way of example, Wireless Local Area Network (WLAN) and Bluetooth™ transceivers may share a common receiver communications path when located at essentially the same place, which is typically referred to as collocation. It is desirable that in a system including collocated WLAN and Bluetooth™ receivers, as much of the radio frequency front end be shared, in particular an antenna and a Low Noise Amplifier (LNA) with possibly a mixer and low pass filter providing a baseband signal to the LNA.

Such systems may have a problem regarding the gain of an LNA that may be shared to amplify the incoming radio signals from an antenna. The gain of the LNA needs to be set to amplify the weakest Radio Frequency (RF) signal for these transceivers while not over amplifying the stronger signal(s). Alternatively, some prior art systems split the signal path in front of two LNA's, one for each receiver. This approach has the disadvantage of reducing the signal sensitivity, possibly by as much as three decibels (db).

Once one transceiver is receiving data, the gain cannot change without potentially corrupting the reception of the frame or packet for that transceiver. Often, one transceiver starts receiving a frame and setting the LNA gain. The second transceiver starts receiving a packet while the first reception is still going on. If the LNA gain is set too low, the second reception may be corrupted. If the LNA gain is set too high, the amplification of the second signal may be too large and the LNA may be driven into a non-linear region of response and the reception of the second frame may be corrupted. To simply this disclosure but not limit the scope of the claims the unit of reception for relevant communications protocols will be referred to as a packet.

Several attempts to solve this problem have been considered. While a LNA with a wider dynamic range can be used, such amplifiers require greater power, which increases the power consumption of the corresponding system all the time to solve a problem that typically only shows up some of the time. Another approach sets the gain of the LNA to provide one of the two circuits with the average Received Signal Strength Indication (RSSI) and provide the other circuit with a gain that provides a stronger signal. This approach has the problem that Bluetooth™ can maintain an RF link to multiple physical links at once, each with its own RSSI, possibly making the use of average RSSI insufficient. Methods and apparatus are needed that support control of the LNA gain to concurrently support reception of both WLAN and Bluetooth™ signals.

SUMMARY

Embodiments include a system with a collocated Primary Receiver (PR) and a Time Synchronized (TS) receiver that includes a Low Noise Amplifier (LNA) configured by a LNA gain control signal to create a shared amplified signal sent to the PR and the TS receiver. The PR receives a timed signal strength prediction for an upcoming TS packet to be received by the TS receiver and responds to this by generating the LNA gain control signal so that the PS may receive a packet concurrently with the TS receiver receiving the upcoming TS packet. A Multi-Chip Module (MCM) may include some or all of these components.

The PR and the TS receiver may use an overlapping band as their operating frequency window, which may in some embodiments include a version of the Instrument, Scientific and Medical (ISM) band, which may in some further embodiments include an operating frequency near 2.4 Gigahertz (GHz). In certain embodiments the primary receiver may receiver a packet and/or implement a Spread Spectrum Receiver (SSR) and the TS receiver may implement a Frequency Hopping (FH) receiver. The SSR may include an SSR analog interface configured to receive the shared amplified signal to generate an SSR baseband signal. The SSR baseband signal is presented to an SSR amplifier whose gain is controlled by an SSR gain also generated by the SSR. The SSR amplifier generates an amplified SSR baseband signal that is used to generate the SS packet.

Embodiments may also include an integrated circuit comprising the LNA and the Primary Radio (PR) as shown in FIG. 1, and may further include the SSR as shown in FIG. 2. The integrated circuit may further comprise the TS receiver as shown in FIG. 1 and may further comprise the FH receiver as shown in FIG. 3. Other embodiments may include a second integrated circuit comprising the FH receiver as shown in FIG. 2.

The spread spectrum receiver and/or the frequency hopping receiver may operate a separate Automatic Gain Control (AGC) as shown in FIG. 3. The spread spectrum receiver AGC may be coupled to the LNA to control the gain control signal and coupled to a spread spectrum receiver amplifier to control the spread spectrum amplifier gain. The frequency hopping AGC may be coupled to the spread spectrum AGC to provide timed signal strength predictions to the spread spectrum receiver AGC, which gives predicted upcoming signal strengths for scheduled frequency hopping receptions. The frequency hopping AGC may also be coupled to an amplifier to control its gain, which may be referred to as the frequency hopping gain.

In some embodiments, the system may operate as follows. The LNA receives a radio frequency signal from an antenna to create the shared amplified signal based upon the LNA gain control signal generated by the spread spectrum AGC.

The PR and further, the spread spectrum receiver, may include an analog interface that responds to the shared amplified signal to create a spread spectrum baseband signal that is presented to the spread spectrum amplifier, which generates an amplified spread spectrum baseband signal based upon the spread spectrum gain generated by the spread spectrum receiver's AGC. The amplified spread spectrum baseband signal may be presented to the spread spectrum receiver's Analog to Digital Converter to create a digital channel signal that is presented to the spread spectrum receiver's signal processor to further create the SS packet and also presented to its AGC.

The TS receiver and further, the frequency hopping receiver, may include a frequency hopping amplifier that responds to the shared amplified signal to create an amplified baseband signal that is presented to the frequency hopping analog interface to create a frequency hopping channel signal. The frequency hopping channel signal may be presented to the frequency hopping receiver's analog to digital converter to create the frequency hopping digital channel signal sent to the frequency hopping receiver's signal processor to further create the upcoming frequency hopping packet and also sent to the frequency hopping AGC. The term frequency hopping amplifier may refer to the use of this amplifier in the TS receiver, or more specifically, the frequency hopping receiver. The amplifier itself may not frequency hop and in some embodiments may have a wide enough bandwidth to support the whole operational bandwidth of an ISM implementation. Also, the TS receiver may receive information about the LNA gain setting from the primary receiver, which may in turn be used to manage the TS transceivers, possibly through control of the transmission power.

The SSR and/or the FH receiver may include at least one instance of a computer accessibly coupled to a computer readable memory and instructed by a program system including program steps residing in the memory to implement the process and/or a finite state machine. In certain further embodiments, the SSR AGC and/or FHR AGC may include at least one instance of a computer and/or a finite state machine.

DESCRIPTION OF EMBODIMENT(S)

Figure 2:
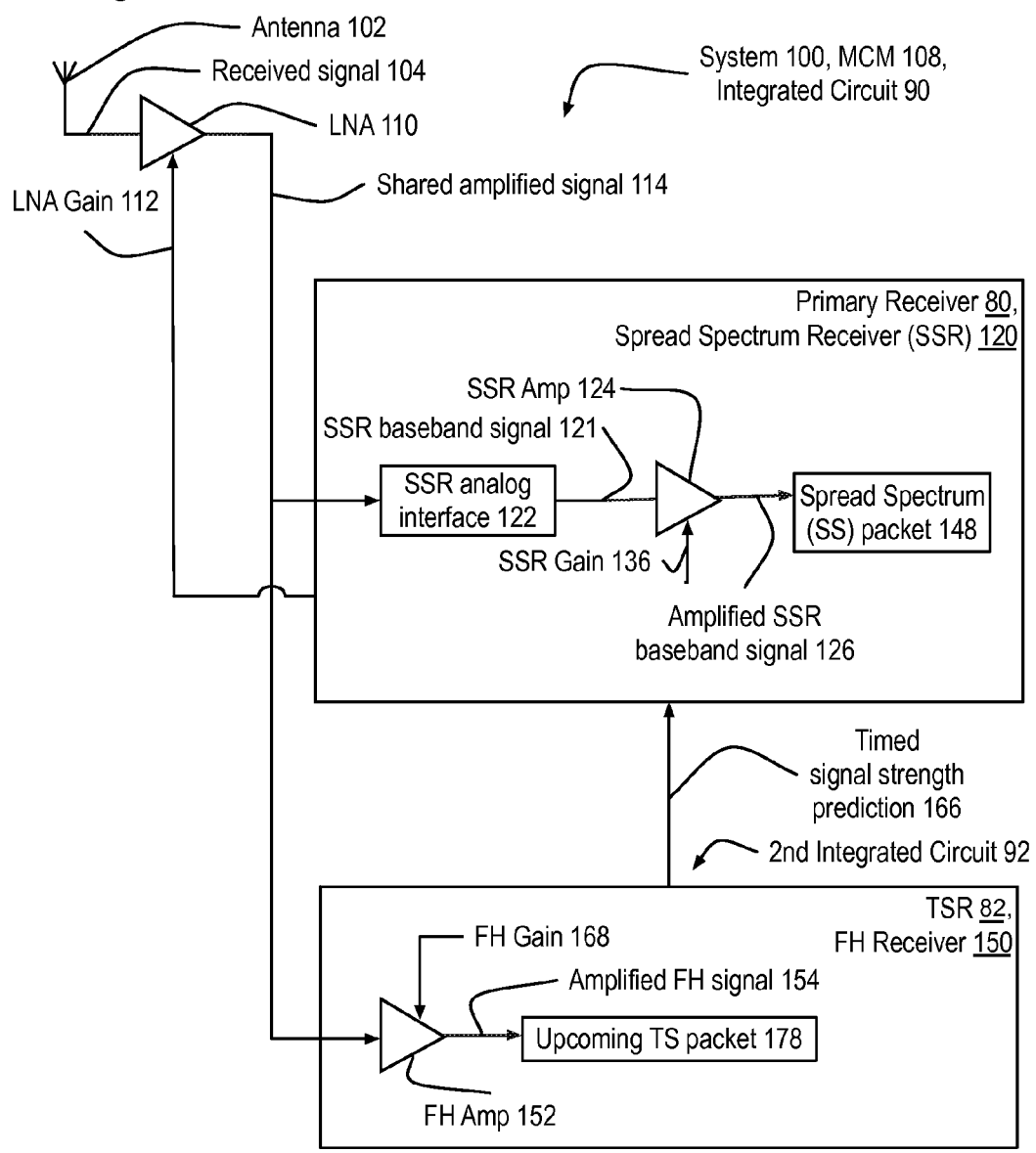
FIG. 2 shows a simplified block diagram of some details of the system, the multi-chip module and/or the integrated circuit of FIG. 1 with the primary receiver receiving a time signal strength prediction from the time synchronized receiver, and the primary receiver generating a LNA gain control signal in response to the received estimate with both receivers adjusting the gains of internal amplifiers to enable both to concurrently receive signals.

This disclosure relates to a Wireless Local Area Networks (WLAN) and Bluetooth™ receiver coexistence scheme, and more generally to collocated primary and time synchronized receivers that share a common antenna and low noise amplifier producing a shared amplified signal. A system 100 is disclosed herein including a collocated Primary Receiver (PR) 80 and a Time-Synchronized (TS) receiver 82, with an Low Noise Amplifier (LNA) 110 configured by a LNA gain control signal 112 to create a shared amplified signal 114 sent to the PR 80 and the TS reciever 82 for them to concurrently receive signals. As shown in FIG. 2, the PR 80 may include a spread spectrum receiver (SSR) 120 and the TS Receiver (TSR) 82 may include a frequency hopping receiver (FHR) 150. Also disclosed are an integrated circuit 90 including the LNA 110 and the SSR 120 and possibly further including the FHR 150 (not shown). Also disclosed is a second integrated circuit 92 that may include the FHR 150. A Multi-Chip Module (MCM) 108 may include at least two of the LNA 110, the PR 80 and/or the TSR 82.

Figure 1:
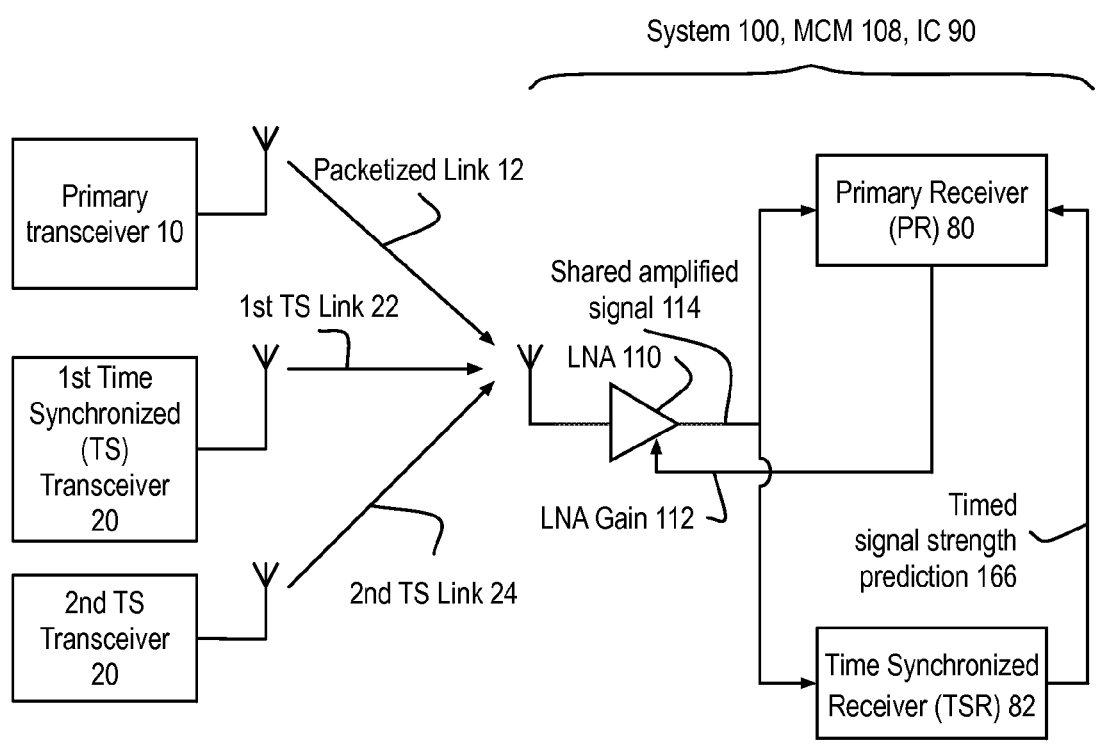
FIG. 1 shows a simplified block diagram of a system, a multi-chip module and/or an integrated circuit including collocated primary and time synchronized receivers sharing a Low Noise Amplifier (LNA) and configured to concurrently receive signals from a primary transceiver and at least two time synchronized transceivers through distinct links and possibly distinct signal strengths.

Referring to the drawings more particularly by reference numbers, FIG. 1 shows a simplified block diagram of the system 100, a multi-chip module 108 and/or the integrated circuit 90 including the collocated primary and time synchronized receivers 80 and 82 respectively, each sharing the LNA 110 and configured to concurrently receive information from a primary transceiver 10 and information from one of at least two time synchronized transceivers 20 through distinct links 12, 22 and 24, respectively. These links may possibly have distinct signal strengths. The primary receiver 80 may be configured to receive a timed signal strength prediction 166 for information to be received by the time synchronized receiver 82 and may respond to this by generating the LNA gain control signal 112 so that the primary receiver 80 may receive information from the primary transceiver 10 concurrently with the time synchronized receiver 82 receiving the upcoming information from one of the time synchronized transceivers 20. Other embodiments of the system 100 may include a system comprised of multiple chips disposed on a single printed circuit board (pcb) or disposed on two or more pcbs. Furthermore, some embodiments may couple the multiple chips and/or pcbs with connectors, wires, flex cables, pins, sockets or other pcbs.

FIG. 2 shows a simplified block diagram of some details of the system 100, the multi-chip module 108 and/or integrated circuit 90 of FIG. 1 with the primary receiver 80 including a spread spectrum receiver 120 receiving a timed signal strength prediction (or estimate) 166 from the time synchronized receiver 82 that includes a frequency hopping receiver 150, possibly in a second integrated circuit 92. The spread spectrum receiver 120 may generate the LNA gain control signal 112 in response to the received estimate with both receivers adjusting the gains of internal amplifiers to enable both to concurrently receive packets. The SSR 120 may include an SSR analog interface 122 configured to receive the shared amplified signal 114 to generate an SSR baseband signal 121 presented to an SSR amplifier 124 whose gain is controlled by an SSR gain 136 also generated by the SSR 120. The SSR amplifier 124 may generate an amplified SSR baseband signal 126 used to generate the SS packet 148. The integrated circuit 90 may include the LNA 110 and the SSR 120 as shown in FIG. 2 and may further include the TSR 82 as shown in FIG. 1. Alternatively, a second integrated circuit 92 may include the FH receiver 150 as shown in FIG. 2. In some embodiments, one or more of the signals described herein may be coupled through pins, contact pads or other similar means. For example, if the multi-chip module 108 includes at least two integrated circuits, then signals may be coupled between integrated circuits through pins, contract pads, bond wires, etc.

The SSR 120 may receive the timed signal strength prediction 166 sent by the FH receiver 150 for the upcoming information as an upcoming TS packet 178 and may respond to this by generating the LNA gain control signal 112 so that the SSR 120 may receive a Spread Spectrum (SS) packet 148 concurrently with the FH receiver 150 receiving the upcoming TS packet 178. The SSR 120 may include the SSR analog interface 122 configured to receive the shared amplified signal 114 to generate, possibly through the use of down conversion, the SSR baseband signal 121 presented to the SSR amplifier 124 whose gain is controlled by the SSR gain 136 also generated by the SSR 120. The SSR amplifier 124 may generate the amplified SSR baseband signal 126 used to generate the SS packet 148. The SSR 120 may send an LNA gain setting 135 to the FHR 150, or more generally the primary receiver 80 may send the LNA setting 135 to the TSR 82, as shown in FIGS. 2 and 3.

Figure 3:
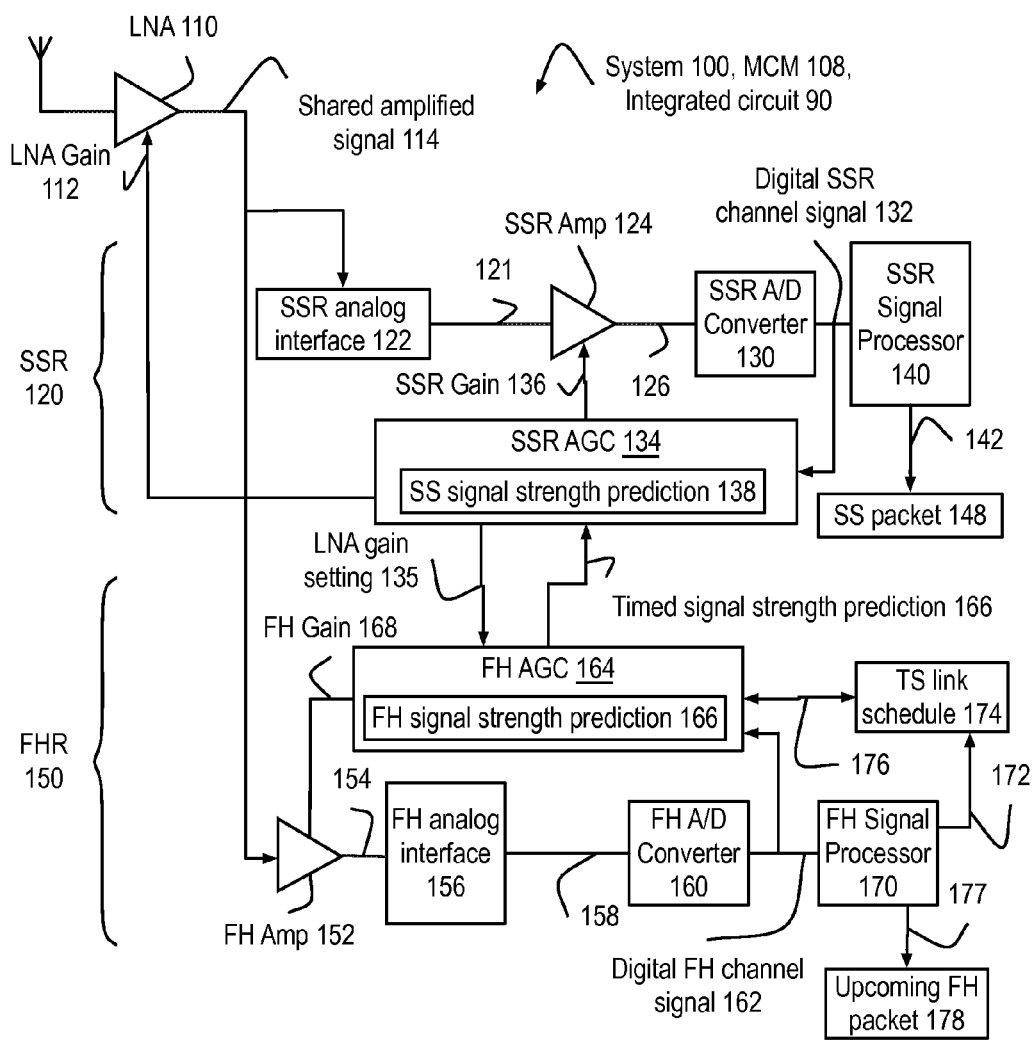
FIG. 3 shows a more detailed block diagram of the system and/or the multi-chip module and receivers of previous Figures with each receiver including an Automatic Gain Control (AGC), with the frequency hopping receiver using a time synchronized link schedule and/or receiving a LNA gain setting from the primary receiver to further refine the operations previously described, and with the primary receiver possibly implementing a spread spectrum protocol and the time synchronized receiving implement a frequency hopping protocol.

FIG. 3 shows a more detailed block diagram of the system 100 and integrated circuit 90 with the primary receiver 80, or more particularly the SSR 120, including an Automatic Gain Control (AGC) 134 and the time synchronized receiver 82, or more particularly the frequency hopping receiver 150, including a frequency hopping (FH) AGC 164. The frequency hopping receiver 150 may use a TS link schedule 174 to further refine the operations previously described.

The SSR AGC 134 may be coupled to the LNA 110 to control the LNA gain control signal 112 and to the SSR amplifier 124 to control the spread spectrum amplifier gain 136. The FH AGC 164 may be coupled to the SSR AGC 134 to provide the timed signal strength prediction 166 to the SSR AGC 134 giving predicted upcoming signal strengths for scheduled frequency hopping receptions in one or successive time windows. The FH AGC 164 may also be coupled to an FH amplifier 152 in the frequency hopping receiver 150 (referred to as the frequency hopping amplifier 152) to control its gain 168, referred to as the frequency hopping gain 168. The frequency hopping amplifier 152 that receives the frequency hopping gain 168 (and also creates an amplified frequency hopping baseband signal 154) are further shown in the frequency hopping receiver 150 of FIG. 2.

The system 100 may normally operate as follows. As shown in FIGS. 2 and 3, the LNA 110 receives a radio frequency signal, referred to as a received signal 104 from an antenna 102 to create the shared amplified signal 114 based upon the LNA gain control signal 112 generated by the spread spectrum receiver 120 and possibly its AGC 134. The radio frequency signal 104 may be shared by the spread spectrum receiver 120 and the frequency hopping receiver 150. The received signal 104 may comply with at least one nation's standard for an Industrial, Scientific and Medical (ISM) frequency band somewhere near 2 and four tenths Gigahertz (GHz). The spread spectrum receiver 120 may comply with a version of the IEEE 802.11 wireless communications protocol that may be referred to as a Wireless Local Area Network (WLAN) protocol. The frequency hopping receiver 150 may comply with a version of the IEEE 802.15.1 wireless communications protocol or a version of the Bluetooth™ protocol set forth by the Bluetooth™ Special Interest Group hereinafter referred to as the BT protocol.

The spread spectrum receiver 120 may include the SSR analog interface 122 configured to respond to the shared amplified signal 114 to down mix and create the SSR baseband signal 121 that is presented to the SSR amplifier 124. The SSR amplifier 124 generates the amplified SSR baseband signal 126 based upon the SSR gain 136 generated by the spread spectrum receiver's AGC 134. The amplified SSR baseband signal 126 may be presented to the spread spectrum receiver's Analog to Digital Converter 130 to create a digital SSR baseband signal 132 that is presented to the spread spectrum receiver's signal processor 140 and to its AGC 134. The SSR signal processor 140 may at least partly create via signal 142 the spread spectrum packet 148. The SSR AGC 134 may use the digital SSR baseband signal 132 with knowledge of the gain signals 112 and/or 136 to create a spread spectrum signal strength prediction 138 that may implement a form of a Received Signal Strength Indicator (RSSI) and/or may implement a version of a gain setting such as may be needed for the Frequency hopping gain control signal 168.

The frequency hopping receiver 150 may be configured so that the FH amplifier 152 responds to the shared amplified signal 114 to create the amplified FH signal 154. The FH signal 154 is presented to the FH analog interface 156 to down mix and create an FH channel signal 158 that is presented to the FH receiver's analog to digital converter 160 to create the digital FH channel signal 162, which is sent to the FH signal processor 170 and to the FH AGC 164. The FH signal processor 170 may at least partly create via signal 177 the upcoming FH packet 178 (also referred to as the upcoming TS packet) in its time window, as well as contribute 172 to the TS link schedule 174. The FH receiver 150, and in some embodiments the FH AGC 164, may use the TS link schedule 174 to create via signal 176 the timed signal strength prediction 166 sent to the spread spectrum receiver 120 and possibly sent to the SSR AGC 134.

Figure 4:
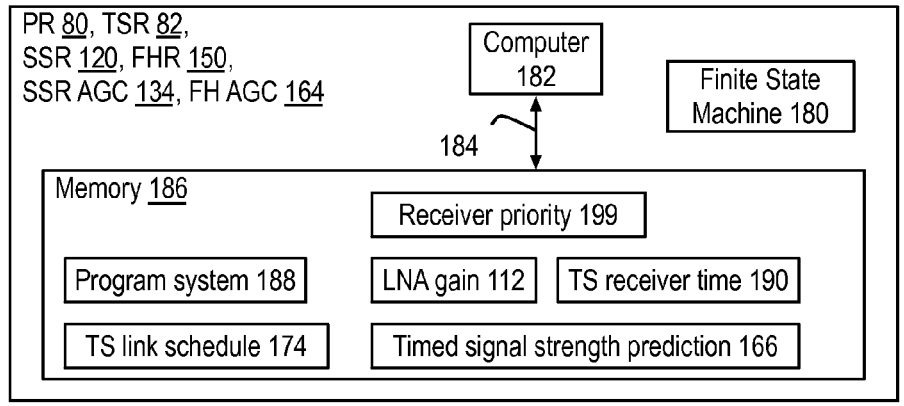
FIG. 4 shows at least one of the primary receiver, the time synchronized receiver, the spread spectrum receiver, the frequency hopping receiver, and/or their corresponding AGC's, which include at least one instance of a finite state machine and/or a computer instructed by a program system residing in a memory accessibly coupled to the computer.

FIG. 4 shows at least one of the primary receiver 80, the time synchronized receiver 82, the spread spectrum receiver 120, the frequency hopping receiver 150, the spread spectrum receiver AGC 134 and/or frequency hopping receiver AGC 164, which may include at least one instance of a finite state machine 180 and/or at least one instance of a computer 182 instructed by a program system 188 residing in a computer readable memory 186 accessibly coupled via path 184 to the computer 182. The memory 186 may further include any of the TS link schedule 174, a representation of the LNA gain control signal 112, at least one of the timed signal strength predictions 166 and/or a time synchronized (TS) receiver time 190 that may be used to synchronize the LNA gain for the reception of the upcoming TS packet 178 described in the previous Figures. The memory 186 may include non-volatile and/or volatile memory components that may or may not preserve the program system 188.

As used herein, any computer 182 includes at least one data processor and at least one instruction processor instructed by the program system 188, where each of the data processors is instructed by at least one of the instruction processors.

As used herein, a finite state machine 180 receives at least one input, maintains and updates at least one state and generates at least one output based upon the value of at least one of the inputs and/or the value of at least one of the states.

Several of the following Figures show flowcharts. These flowcharts show some method embodiments, which may include arrows signifying a flow of control, and sometimes data, supporting various implementations. These may include a program operation, or program thread, executing upon the computer 182 or states of a finite state machine 180. Each of these program steps may at least partly support the operation to be performed. Other circuitry such as radio components, specialized encoders and/or decoders, memory management and so on may also be involved in performing the operation. The operation of starting a flowchart refers to entering a subroutine or a macro instruction sequence in the computer 182 or of a possibly initial state or condition of the finite state machine 180. The operation of termination in a flowchart refers to completion of those operations, which may result in a subroutine return in the computer 182 or possibly return the finite state machine 180 to a previous condition or state. The operation of terminating a flowchart is denoted by a rounded box with the word "Exit" in it.

Figure 5:
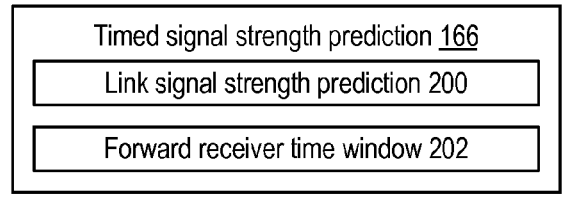
FIG. 5 shows some details of the timed signal strength estimate of FIGS. 2 to 4.

FIG. 5 shows some details of the timed signal strength prediction 166 of FIGS. 1 to 4, which may include a link signal strength prediction 200 and a forward receiver time window 202 for the time synchronized receiver 82. The link signal strength prediction may be a form of RSSI and/or a form of prediction regarding the frequency hopping gain 168 required for reliable reception of the upcoming FH packet 178. The forward receiver time window 202 may designate a starting receiver time and an ending receiver time that may be estimated by the primary receiver 80 using the time synchronized (TS) receiver time 190 of FIG. 4.

Figure 6:
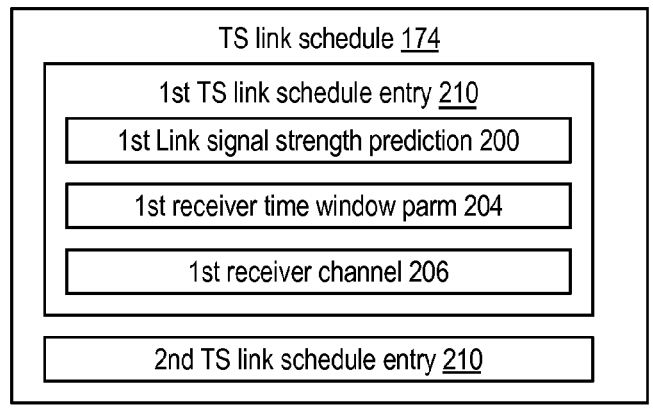
FIG. 6 shows some details of the time synchronized link schedule of FIG. 3 with an entry including a link signal strength estimate, a time window for reception of a upcoming frequency hopping packet in a receive channel.

FIG. 6 shows some details of the TS link schedule 174 of FIG. 3. The TS link schedule 174 is shown with a first TS link first schedule entry 210 including a link signal strength prediction 200 and time window parameters 204 that can be used to generate the forward receiver time window 202 of FIG. 5 for reception of the upcoming time synchronized packet 178 in the receiver channel 206. Each of the FH links 22 and 24 shown in FIG. 1 may have a separate entry 210 (e.g., second entry 210) in the TS link schedule 174.

Figure 7:
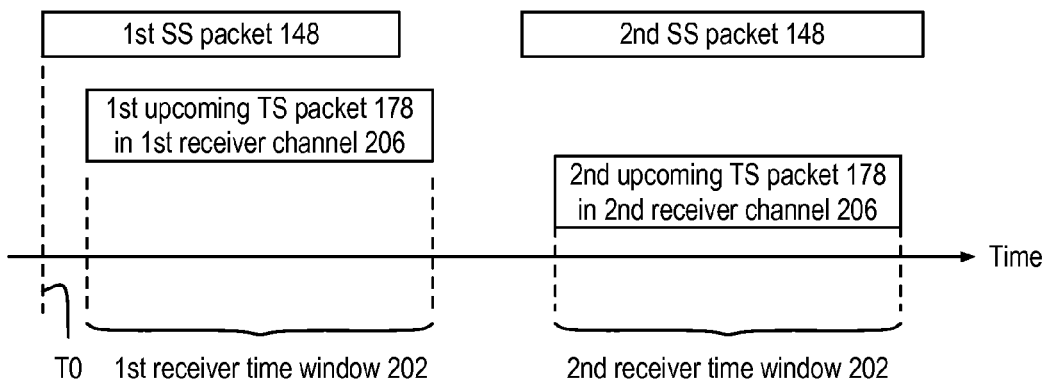
FIG. 7 shows a traffic diagram of spread spectrum packets being concurrently received with time synchronized packets in accord with the time synchronized link schedule of FIG. 6.

FIG. 7 shows a traffic diagram of spread spectrum packets 148 (i.e., first and second SS packets 148) being concurrently received with time synchronized packets 178 (i.e., first and secind upcoming TS packets 178) in accord with the time synchronized link schedule 174 of FIG. 6. The horizontal axis represents time. Note that the first TS packet 178 is in a first receiver time window 202 on a first receiver channel 206, and that the second TS packet 178 is in a second receiver time window 202 on a second receiver channel 206, that for a frequency hopping protocol such as Bluetooth™, are probably different channels within the ISM band and may be in non-overlapping time windows.

Figure 8:
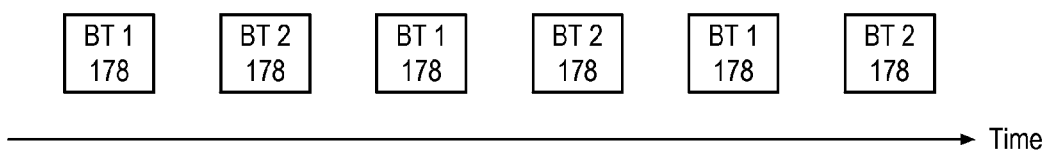
FIG. 8 shows an example of the time synchronized packets which may be implemented in accord with a version of a frequency hopping communications protocol.

FIG. 8 shows an example of the time synchronized packets 178 from the first TS link 22 and the second TS link 24, as shown in FIG. 1, which may be implemented in accordance with a version of a frequency hopping communications protocol such as Bluetooth™ (BT) protocol. The packets from the first TS transceiver 20 are labeled BT1 and the packets from the second transceiver 20 are labeled BT2. Leaving aside which frequency channel these packets are transmitted on and just looking at the time of transmission as shown by the horizontal axis, these packets begin at regular starting times.

Figure 9:
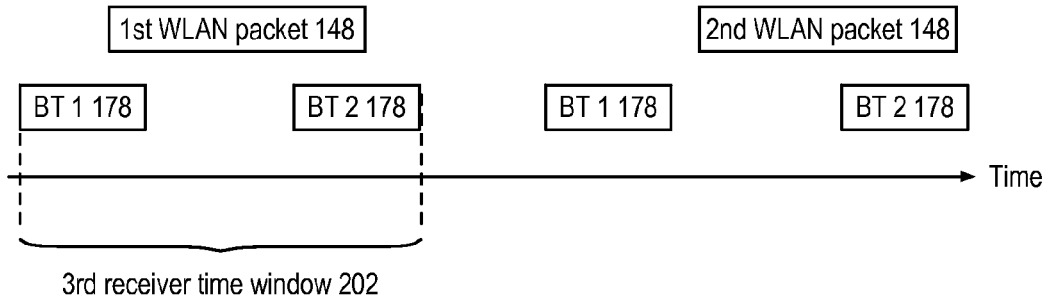
FIG. 9 shows an example of some further details of the concurrent reception of spread spectrum packets as WLAN packets.

FIG. 9 shows some further details of the concurrent reception of SS packets 148 as WLAN packets in accord with some form of IEEE 802.11. The first WLAN packet 148 starts reception during the reception of a BT1 packet 178 and continues during the reception of a BT2 packet 178.

Figure 10:
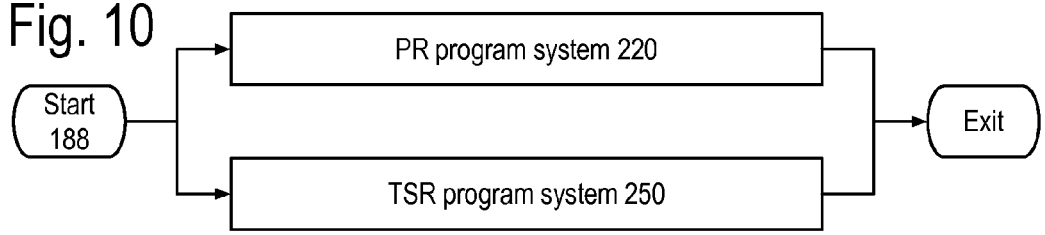
FIG. 10 shows a flow chart of the program system of FIG. 4 may implement a primary receiver program system and/or a time synchronized receiver program system.

FIG. 10 shows a flow chart of the program system 188 of FIG. 4 that may implement a primary receiver 80 program system 220 and/or a time synchronized receiver 82 program system 250. The primary receiver program system may further implement a spread spectrum receiver (SSR) 120 program system that may further implement a WLAN receiver program system. The TSR program system 250 may further implement a frequency hopping receiver 150 program system that may further implement a Bluetooth™ receiver program system.

Figure 11:
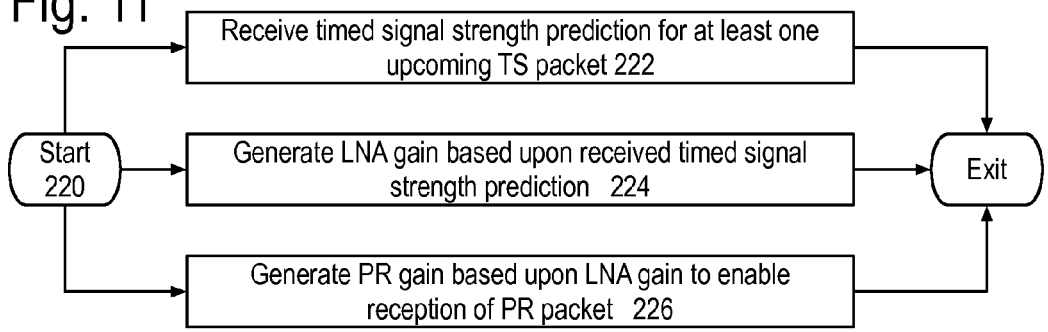
FIG. 11 shows some details of the primary receiver program system including receiving the timed signal strength prediction, generating the LNA gain to enable both receivers to concurrently receive packets in the near future and generate the spread spectrum receiver gain based upon the LNA gain to receive the spread spectrum packet.

FIG. 11 shows some details of the primary receiver 80 program system 220 that may include the following. Program step 222 supports receiving the timed signal strength prediction 166 for at least one of the upcoming TS packets 178. Program step 224 supports generating the LNA gain 112 based upon the received timed signal strength prediction 166. And program step 226 supports generating the PR gain, in particular the SSR gain 136 to enable reception of the PR packet as shown by the example of the SS packet 148.

Figure 12:
FIG. 12 shows the primary program receiver program system may include a spread spectrum AGC program system that may further support the program steps of FIG. 9.

FIG. 12 shows the primary receiver 80 program system 220, in particular the spread spectrum receiver 120 program system 220, which may further include a SSR AGC 134 program system 228. Note that the SSR AGC program system 228 and/or the SSR AGC 134 may further support receiving the digital SSR baseband signal 132 to create and/or update a spread spectrum signal estimate 138, possibly for a specific spread spectrum link 12 to the SS transceiver 10 of FIG. 1. This spread spectrum signal strength prediction 138 may be used to compensate for the LNA gain 112 in creating the SSR gain 136.

The timed signal strength prediction 166 may further enable both receivers 80 and 82 to concurrently receive packets 148 and 178 in the near future and generate the spread spectrum receiver gain 136 based upon the LNA gain to enable reception of the spread spectrum packet 148. In other embodiments, the timed signal strength prediction 166 may be used to enable the TS receiver 82 to be insured optimal gain for receiving its packets.

Figure 13:
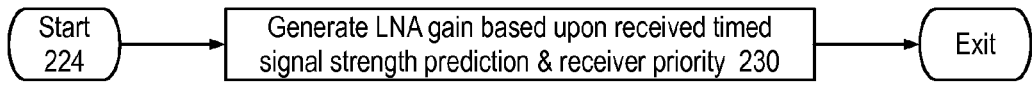
FIG. 13 shows an example of one of the program steps of FIG. 11.

FIG. 13 shows some details of the program step 224 as the program step 230 that may support generating the LNA gain 112 based upon the received timed signal strength prediction 166 and the receiver priority 199 of FIG. 4.

Figure 14:
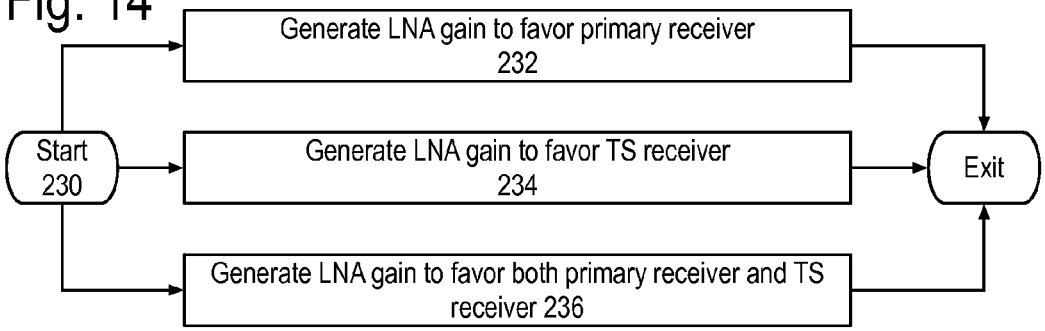
FIG. 14 shows an example of the program step of FIG. 13.

FIG. 14 shows some details of the program step 230 of FIG. 13 to further generate the LNA gain 112 based upon the received timed signal strength 166 and the receiver priority 199, which may comprise at least one of the following program steps: Program step 232 supports generating the LNA gain 112 to favor the primary receiver 80, possibly further favoring the spread spectrum receiver 120, and further possibly favoring a WLAN receiver. Program step 234 supports generating the LNA gain 112 to favor the time synchronized receiver 82, possibly further favoring the frequency hopping receiver 150 and further possibly favoring a Bluetooth™ receiver. And program step 236 supports generating the LNA gain 112 to favor both the primary receiver 80 and the time synchronized receiver 82 with similar refinements as just discussed for the two proceeding program steps.

The program steps of FIG. 14 may be implemented as part of the program system 220 without the use of the receiver priority 199 in some embodiments. These program steps may be installed by an installation package residing in the memory 186, possibly in a non-volatile memory component accessed upon startup. Now consider the three time windows 202, the first two being shown in FIG. 7 and the third being shown in FIG. 9 in terms of various embodiments described herein.

Looking at the first receiver timing window 202 of FIG. 7, if the program system 220 implements program step 232, the received timed signal strength 166 may be ignored compared to the packetized link 12 received signal strength prediction in setting the LNA gain 112. If the program system 220 implements the program step 234, then the LNA gain 112 is set based predominantly upon the received timed signal strength prediction 166 for the first time synchronized link 22. If the program system 220 implements program step 236, then the LNA gain 112 is set based upon both the received signal strength prediction 166 for the first time synchronized link 22 and the first packetized link 12's received signal strength prediction.

Looking at the second receiver timing window 202 of FIG. 7, if the program system 220 implements the program step 232, only the first packetized link 12's received signal strength need be used to generate the LNA gain 112. If the program system 220 implements the program step 234, then after the end of receiving the first SS packet 148 and the first TS packet 178, the LNA gain 112 may be set based upon a second timed signal strength indicating the second TS link 24's signal strength.

Figure 15:
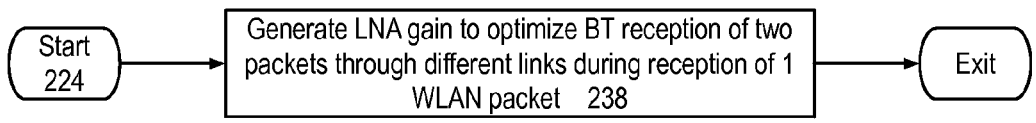
FIG. 15 shows an example refinement of one of the program steps of FIG. 11.

Before considering the third timing window 202 shown in FIG. 9, consider the following refinement to the program system 220 may be implemented:

FIG. 15 shows a refinement of the program step 224 generating the LNA gain including program step 238 that supports generating the LNA gain 112 to optimize Bluetooth™ reception of two packets BT1 and BT2 through different links 22 and 24 during the reception of one WLAN packet 148. If the program system 220 implements the program step 232, then the LNA gain 112 is set based primarily upon the packetized link 12. If the program system 220 implements the program step 234, then the LNA gain 112 is set to optimize both reception of BT1 and BT2, which may be done before the first WLAN packet 148 starts to be received, possibly with the frequency hopping gain 168 being changed between the end of receiving the first BT1 packet and the start of reception of the BT2 packet. If the program system 220 implements the program step 236, then the LNA gain 112 may be set taking into account all three links 12, 22 and 24 received signal strength predictions, with the frequency hopping gain 168 possibly being changed between reception of the BT1 and BT2 packets.

Figure 16:
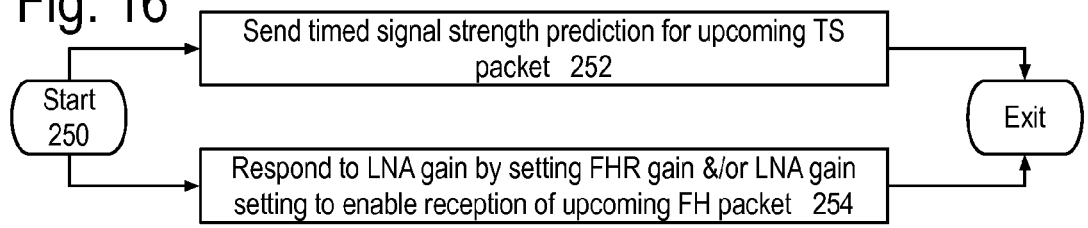
FIG. 16 shows a flow chart of the time synchronized receiver program system that may include sending the timed signal strength prediction for at least one upcoming frequency hopping packet and responding to the LNA gain to enable reception of the upcoming frequency hopping packet.

FIG. 16 shows a flow chart of the Time Synchronized (TS) receiver 82 program system 250, possibly optimized for a frequency hopping receiver 150 embodiment that may include the following. Program step 252 supports sending the timed signal strength prediction 166 for at least one upcoming time synchronized packet 178 to the primary receiver 80, possibly implementing the spread spectrum receiver 120 and further possibly to the spread spectrum receiver's AGC 134. And program step 254 supports responding to the LNA gain 112 and/or the LNA gain setting 135 to enable reception of the upcoming time synchronized packet 178.

Figure 17:
FIG. 17 shows a detail of sending the timed signal strength prediction that may include generating the timed signal strength prediction from the time synchronized link schedule.

FIG. 17 shows a detail of the program step 252 sending the timed signal strength prediction 166. Program step 256 supports generating the timed signal strength prediction 166 from the time synchronized link schedule 174, possibly in a fashion similar to the discussion of FIGS. 5, 6, 7 and 9 above.

Figure 18:
FIG. 18 shows a detail of the frequency hopping receiver program system that may include its AGC supporting the program steps of FIGS. 16 and/or 17.

FIG. 18 shows a detail of the time synchronized receiver 82 program system 250 possibly further implementing the frequency hopping receiver 150 program system 250. Program system 258 of the frequency hopping receiver's AGC 164 may support the program steps of FIGS. 16 and/or 17 being implemented at least in part within the AGC 164.

The preceding embodiments provide examples and are not meant to constrain the scope of the following claims.

What is claimed is:

1. A system comprising:
   a Low Noise Amplifier (LNA) configured to generate a shared amplified signal based on a received signal derived from an antenna and an LNA gain signal;
   a Time Synchronized (TS) receiver configured to generate a timed signal strength prediction signal, associated with a next TS packet scheduled to be received at the TS receiver, based on said shared amplified signal and said LNA gain signal; and
   a primary receiver configured to receive said shared amplified signal and said timed signal strength prediction signal, the primary receiver comprising an automatic gain control (AGC) unit configured to generate said LNA gain signal based, at least in part, on said timed signal strength prediction signal to enable said TS receiver to receive said next TS packet.

2. The system of claim 1, wherein said TS receiver further comprises a Frequency Hopping (FH) receiver configured to receive said shared amplified signal and said LNA gain signal and to generate said timed signal strength prediction signal associated with the next TS packet scheduled to be received at the FH receiver, the FH receiver further comprising:
   an FH amplifier configured to receive an FH gain and said shared amplified signal to create an amplified FH signal by operating said FH amplifier in its linear mode in response to a start of reception of said next TS packet based upon said LNA gain signal and said timed signal strength prediction signal.

3. The system of claim 2, wherein said primary receiver comprises a Spread Spectrum receiver (SSR), the SSR comprising:
   the AGC unit configured to generate said LNA gain signal based, at least in part, on said timed signal strength prediction signal received at the AGC unit; and
   an SSR amplifier configured to receive an SSR gain and an SSR baseband signal to create an amplified SSR baseband signal by operating said SSR amplifier in its linear mode.

4. The system of claim 3, wherein said SSR is further configured to schedule generating said LNA gain signal to enable said FH amplifier to operate in said linear mode to receive said next TS packet.

5. The system of claim 3, wherein said SSR is compatible with a version of an IEEE 802.11 communications protocol.

6. The system of claim 1, wherein said AGC unit is further configured to receive a digital baseband signal to generate a first receiver signal strength prediction to further direct said AGC unit in generating said LNA gain signal.

7. The system of claim 1, wherein said primary receiver is further configured to set a maximum for said LNA gain signal to insure reception of said next TS packet.

8. The system of claim 3, wherein said SSR is configured to respond to at least two timed signal strength prediction signals to generate said LNA gain signal based upon a first FH link to enable said FH receiver to receive said next TS packet from a first FH transceiver during a first time window and based upon a second FH link to receive said next TS packet from a second FH transceiver during a second time window.

9. The system of claim 2, wherein said FH receiver is compatible with a version of a Bluetooth™ communication protocol.

10. The system of claim 2, wherein said FH receiver further comprises an FH Automatic Gain Control (AGC) configured to generate said timed signal strength prediction signal and said FH gain in response to said LNA gain signal by said start of said reception of said next TS packet.

11. The system of claim 10, wherein said FH AGC is configured to access a TS link schedule to at least partly create said timed signal strength prediction signal.

12. The system of claim 2, wherein said FH receiver is configured to generate at least two timed signal strength prediction signals and provide the at least two timed signal strength prediction signals to the primary receiver to generate said LNA gain signal based upon a first FH link to enable reception of said next TS packet from a first FH transceiver during a first time window and based upon a second FH link to receive said next TS packet from a second FH transceiver during a second time window.

13. The system of claim 1, comprising a multi-chip module comprising at least two members of the group consisting of said Low Noise Amplifier, said TS receiver and said primary receiver.

14. An integrated circuit comprising:
a Low Noise Amplifier (LNA) configured to generate a shared amplified signal based on a received signal derived from an antenna and an LNA gain signal;
a Time Synchronized (TS) receiver configured to generate a timed signal strength prediction signal, associated with a next TS packet scheduled to be received at the TS receiver, based on said shared amplified signal and said LNA gain signal; and
a primary receiver configured to receive said shared amplified signal and said timed signal strength prediction signal, the primary receiver comprising an automatic gain control (AGC) unit configured to generate said LNA gain signal based, at least in part, on said timed signal strength prediction signal to enable said TS receiver to receive said next TS packet.

15. The integrated circuit of claim 14, wherein said primary receiver comprises a Spread Spectrum receiver (SSR) configured to receive said shared amplified signal and said timed signal strength prediction signal for the next TS packet scheduled to be received at the TS receiver, said SSR comprising:
the AGC unit configured to schedule generating said LNA gain signal in response to said timed signal strength prediction signal to enable a Frequency Hopping (FH) amplifier of the TS receiver to operate in a linear mode to receive the next TS packet;
an SSR amplifier configured to receive an SSR gain and an SSR baseband signal to create an amplified SSR baseband signal by operating said SSR amplifier in its linear mode.

16. The integrated circuit of claim 15, wherein said SSR is compatible with a version of an 802.11 communications protocol.

17. The integrated circuit of claim 15, wherein said AGC unit of the SSR is further configured to receive a digital SSR baseband signal to generate an SS signal strength prediction signal to further direct said AGC unit in generating said LNA gain signal and said SSR gain.

18. The integrated circuit of claim 15, wherein said SSR is configured to respond to at least two timed signal strength prediction signals to generate said LNA gain signal based upon a first TS link to enable said TS receiver to receive said next TS packet during a first time window from a first FH transceiver and based upon a second TS link to receive said next TS packet from a second FH transceiver during a second time window.

19. The integrated circuit of claim 15, wherein said TS receiver further comprises a FH receiver.

20. The integrated circuit of claim 19, wherein said FH receiver is compatible with a version of a Bluetooth™ communications protocol.

21. The integrated circuit of claim 19, further comprising:
said FH receiver configured to receive said shared amplified signal and said LNA gain signal and to generate said timed signal strength prediction signal for said next TS packet; and
said FH amplifier configured to receive an FH gain and said shared amplified signal to create an amplified FH signal by operating said FH amplifier in said linear mode in response to a start of reception of said next TS packet based upon said LNA gain signal and said timed signal strength prediction signal.

22. The integrated circuit of claim 21, wherein said FH receiver further comprises an FH Automatic Gain Control (AGC) configured to generate said timed signal strength prediction signal and said FH gain in response to said LNA gain signal by said start of said reception of said next TS packet.

23. The integrated circuit of claim 22, wherein said FH AGC is configured to access a TS link schedule to at least partly create said timed signal strength prediction signal.

24. The integrated circuit of claim 21, wherein said FH receiver is configured to generate at least two timed signal strength prediction signals and provide the at least two timed signal strength prediction signals to the primary receiver to generate said LNA gain signal based upon a first FH link to enable reception of said next TS packet from a first FH transceiver during a first time window and based upon a second FH link to receive said next TS packet from a second FH transceiver during a second time window.

25. An integrated circuit comprising:
at least one contact pad to receive a shared amplified signal generated from a Low Noise Amplifier (LNA) based upon an LNA gain signal received from a primary receiver, wherein said LNA operable to amplify at least one received signal to create said shared amplified signal;
a Time Synchronized (TS) receiver comprises a Frequency Hopping (FH) receiver configured to:
receive said shared amplified signal,
generate a timed signal strength prediction signal associated with a next TS packet scheduled to be received at the TS receiver, and
receive said next TS packet based upon said timed signal strength prediction signal and based upon said shared amplified signal, wherein the FH receiver comprises an FH amplifier configured to receive an FH gain and said shared amplified signal to create an amplified FH signal by operating said FH amplifier in a linear mode in response to a start of reception of said next TS packet; and at least one other contact pad to send said timed signal strength prediction signal to said primary receiver, wherein with said LNA gain signal is generated by the primary receiver in response to said timed signal strength prediction signal.

26. The integrated circuit of claim 25, wherein said primary receiver comprises a Spread Spectrum Receiver (SSR) configured to receive said shared amplified signal and said timed signal strength prediction signal associated with the next TS packet, the primary receiver configured to generate said LNA gain signal based upon said timed signal strength prediction signal for said shared amplified signal to be used by both said FH receiver and said SSR to concurrently receive said next TS packet and a Spread Spectrum packet.

27. The integrated circuit of claim 25, wherein said SSR is compatible with a version of an IEEE 802.11 communications protocol.

28. The integrated circuit of claim 25, wherein said FH receiver is compatible with a version of a Bluetooth™ communications protocol.

29. The integrated circuit of claim 25, wherein said FH receiver further comprises an FH Automatic Gain Control (AGC) configured to generate said timed signal strength prediction signal and said FH gain in response to said LNA gain signal by said start of said reception of said next TS packet.

30. The integrated circuit of claim 29, wherein said FH AGC is configured to access a TS link schedule to at least partly create said timed signal strength prediction signal.

31. The integrated circuit of claim 25, wherein said FH receiver is configured to generate at least two timed signal strength prediction signals and provide the at least two timed signal strength prediction signals to the primary receiver to generate said LNA gain signal based upon a first FH link to enable reception of said next TS packet from a first FH transceiver during a first time window and based upon a second FH link to receive said next TS packet from a second FH transceiver during a second time window.

32. A system comprising:
a Low Noise Amplifier (LNA) configured to generate a shared amplified signal based on a received signal derived from an antenna and an LNA gain signal;
a Time Synchronized (TS) receiver comprising a Frequency Hopping (FH) receiver configured to receive said shared amplified signal and said LNA gain signal and generate a timed signal strength prediction signal, associated with a next TS packet scheduled to be received at the TS receiver, based on said shared amplified signal and said LNA gain signal, the FH receiver comprising an FH amplifier configured to receive an FH gain and said shared amplified signal to create an amplified FH signal by operating said FH amplifier in its linear mode in response to a start of reception of said next TS packet based upon said LNA gain signal and said timed signal strength prediction signal; and
a primary receiver configured to receive said shared amplified signal and said timed signal strength prediction signal, the primary receiver configured to generate said LNA gain signal based, at least in part, on said timed signal strength prediction signal.

33. An integrated circuit comprising:
a Low Noise Amplifier (LNA) configured to generate a shared amplified signal based on a received signal derived from an antenna and an LNA gain signal;
a Time Synchronized (TS) receiver configured to generate a timed signal strength prediction signal, associated with a next TS packet scheduled to be received at the TS receiver, based on said shared amplified signal and said LNA gain signal; and
a primary receiver comprising a Spread Spectrum receiver (SSR) configured to receive said shared amplified signal and said timed signal strength prediction signal, the SSR comprising:
an automatic gain control (AGC) unit configured to generate said LNA gain signal based, at least in part, on said timed signal strength prediction signal to enable a Frequency Hopping (FH) amplifier of the TS receiver to operate in a linear mode to receive the next TS packet; and
an SSR amplifier configured to receive an SSR gain and an SSR baseband signal to create an amplified SSR baseband signal by operating said SSR amplifier in its linear mode.

34. A method comprising:
generating, using a Low Noise Amplifier (LNA), a shared amplified signal based on a received signal derived from an antenna and an LNA gain signal;
generating, using a Time Synchronized (TS) receiver, a timed signal strength prediction signal, associated with a next TS packet scheduled to be received at the TS receiver, based on said shared amplified signal and said LNA gain signal;
receiving, at a primary receiver, said shared amplified signal and said timed signal strength prediction signal; and
generating, using an automatic gain control (AGC) unit of the primary receiver, said LNA gain signal based, at least in part, on said timed signal strength prediction signal to enable said TS receiver to receive said next TS packet.

* * * * *